(12) United States Patent
Cohen et al.

(10) Patent No.: US 12,146,769 B2
(45) Date of Patent: *Nov. 19, 2024

(54) CONFORMAL APERTURE ENGINE SENSORS AND MESH NETWORK

(71) Applicant: Fractal Antenna Systems, Inc., Bedford, MA (US)

(72) Inventors: Nathan Cohen, Belmont, MA (US); Alexander Shelman-Cohen, Belmont, MA (US)

(73) Assignee: Fractal Antenna Systems, Inc., Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,254

(22) Filed: May 30, 2023

(65) Prior Publication Data

US 2023/0304834 A1    Sep. 28, 2023

Related U.S. Application Data

(63) Continuation of application No. 17/653,918, filed on Mar. 8, 2022, now Pat. No. 11,662,233, which is a
(Continued)

(51) Int. Cl.
*G01D 11/30* (2006.01)
*G01D 7/00* (2006.01)
(Continued)

(52) U.S. Cl.
CPC .............. *G01D 11/30* (2013.01); *H05K 1/144* (2013.01); *H05K 3/361* (2013.01); *H05K 3/4635* (2013.01); *G01D 7/00* (2013.01)

(58) Field of Classification Search
CPC .......... G01D 11/30; G01D 7/00; H05K 1/144; H05K 3/361; H05K 3/4635
See application file for complete search history.

(56) References Cited

U.S. PATENT DOCUMENTS

| 4,342,036 A | 7/1982 | Scott et al. |
| 4,814,785 A | 3/1989 | Wu |

(Continued)

OTHER PUBLICATIONS

"Antenna Frequency Scaling," The ARRL Antenna Book, 1988, pp. 2-24 to 2-25.
(Continued)

*Primary Examiner* — Paul M. West
(74) *Attorney, Agent, or Firm* — Daly, Crowley, Mofford & Durkee, LLP

(57) ABSTRACT

Wireless sensor devices are described which harvest energy and provide an antenna or antennas for wireless communication on a relatively small form factor, preferably one that is co-extensive with a largest component of the device, e.g., an antenna layer or sensor layer. The devices are able to sense and/or control certain specific parameters of a system; store energy, e.g., in a supercapacitor system or battery system; transmit that as information/signals via a wireless link, e.g., RF or optical link; receive information from other devices and relay that information. Such devices accordingly may be self-powered and wireless devices, and not dependent on a separate device or form factor to provide a power source. Such devices can be entirely autonomous or substantially so, can be mobile or fixed, and may require little servicing over a period of time. The devices can be used as sensor nodes in a wireless mesh network.

10 Claims, 2 Drawing Sheets

Related U.S. Application Data continuation of application No. 16/427,154, filed on May 30, 2019, now Pat. No. 11,268,837, which is a continuation-in-part of application No. 16/405,340, filed on May 7, 2019, now Pat. No. 10,483,649.

(60) Provisional application No. 62/677,789, filed on May 30, 2018.

(51) Int. Cl.
  *H05K 1/14* (2006.01)
  *H05K 3/36* (2006.01)
  *H05K 3/46* (2006.01)

(56) References Cited

U.S. PATENT DOCUMENTS

| | | |
|---|---|---|
| 5,344,729 A | 9/1994 | Akins et al. |
| 5,471,224 A | 11/1995 | Barkeshli |
| 6,104,349 A | 8/2000 | Cohen |
| 6,127,977 A | 10/2000 | Cohen |
| 6,140,975 A | 10/2000 | Cohen |
| 6,445,352 B1 | 9/2002 | Cohen |
| 6,452,553 B1 | 9/2002 | Cohen |
| 6,476,766 B1 | 11/2002 | Cohen |
| 6,985,122 B2 | 1/2006 | Cohen |
| 7,019,695 B2 | 3/2006 | Cohen |
| 7,126,537 B2 | 10/2006 | Cohen |
| 7,145,513 B1 | 12/2006 | Cohen |
| 7,176,838 B1 | 2/2007 | Kinezos |
| 7,190,318 B2 | 3/2007 | Cohen |
| 7,215,290 B2 | 5/2007 | Cohen |
| 7,256,751 B2 | 8/2007 | Cohen |
| 7,345,642 B2 | 3/2008 | Cohen |
| 7,456,799 B1 | 11/2008 | Cohen |
| 11,268,837 B1 | 3/2022 | Cohen et al. |
| 2003/0034918 A1 | 2/2003 | Werner et al. |
| 2004/0227682 A1 | 11/2004 | Anderson |
| 2005/0007289 A1 | 1/2005 | Zarro et al. |
| 2009/0047453 A1 | 2/2009 | Folaron et al. |
| 2017/0062943 A1 | 3/2017 | Patron et al. |
| 2018/0076376 A1 | 3/2018 | Brady et al. |

OTHER PUBLICATIONS

"Fano Bounds for Compact Antennas", Phase 1; JC Allen and J. Meloling, Technical Report 1962, Oct. 2007, SSC San Diego, pp. i to 1.

U.S. Non-Final Office Action dated Sep. 24, 2020 for U.S. Appl. No. 16/427,154; 8 pages.

Response to U.S. Non-Final Office Action dated Sep. 24, 2020 for U.S. Appl. No. 16/427,154; Response filed Mar. 24, 2021; 6 pages.

U.S. Final Office Action dated Jul. 2, 2021 for U.S. Appl. No. 16/427,154; 9 pages.

Response to U.S. Final Office Action dated Jul. 2, 2021 for U.S. Appl. No. 16/427,154; Response filed Oct. 28, 2021; 5 pages.

U.S. Notice of Allowance dated Nov. 18, 2021 for U.S. Appl. No. 16/427,154; 6 pages.

CONFORMAL APERTURE ENGINE SENSORS AND MESH NETWORK

CROSS REFERENCE TO RELATED APPLICATIONS

This application is a continuation of U.S. patent application Ser. No. 17/653,918 entitled "Conformal Aperture Engine Sensors and Mesh Network," filed Mar. 8, 2022, which issues on May 30, 2023 as U.S. Pat. No. 11,662,233, which is a continuation of U.S. patent application Ser. No. 16/427,154 entitled "Conformal Aperture Engine Sensors and Mesh Network," filed May 30, 2019, and issued Mar. 8, 2022 as U.S. Pat. No. 11,268,837, which is a continuation-in-part of U.S. patent application Ser. No. 16/405,340 entitled "Methods and Apparatus for Enhanced Radiation Characteristics from Antennas and Related Components," filed May 7, 2019, and issued Nov. 19, 2019 as U.S. Pat. No. 10,483,649; U.S. patent application Ser. No. 16/427,154 is also based upon and claims priority to U.S. Provisional Patent Application No. 62/677,789, entitled "Conformal Aperture Engine Sensors and Mesh Network," filed May 30, 2018; the entire content of each of the foregoing applications are incorporated herein by reference.

BACKGROUND

Wireless networks have been able to provide people with the ability to communicate worldwide using various radio frequency ("RF") devices. Many tasks, industrial processes, and environmental conditions, however, typically require or benefit from monitoring and/or communication that is autonomous (machine-driven), with little, if any human guidance or intervention, e.g., radiation sensing at locations known to have significant radioactivity. As further examples, many machines typically operate with governors and internal control systems that provide feedback on their environment, energy use and needs, response to varying time driven demands of use, and so on. Most of these now communicate through wired connections through the internet, allowing distant control and monitoring. Wireless sensor networks have been proposed for monitoring devices, processes, and areas but power generation has proven to be problematic or unreliable for such devices.

SUMMARY

An aspect of the present disclosure is directed to wireless devices that harvest energy and provide an antenna or antennas for wireless access or communication on a relatively small form factor, preferably one that is co-extensive with a largest component of the device, e.g., an antenna layer or sensor layer. The devices are able to sense and/or control certain specific parameters of a system; store energy, e.g., in a supercapacitor system or battery system; transmit that as information/signals via a wireless link, e.g., RF or optical link; receive information from other devices and relay that information. Such devices accordingly may be self-powered and wireless devices, and not dependent on a separate device or form factor to provide a power source. Such devices can be entirely autonomous or substantially so, can be mobile or fixed, and may require little servicing over a period of time. Devices according to the present disclosure can thus be used as sensor nodes in a network, e.g., a wireless mesh network.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Figure 1:
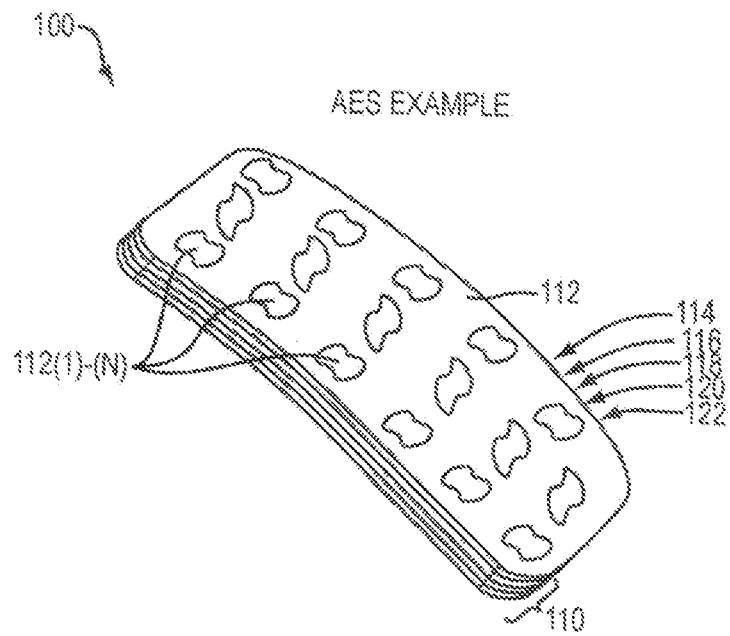
FIG. 1 depicts an example of a general aperture engine sensor (AES) structure, in accordance with exemplary embodiments of the present disclosure.

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

An aspect of the present disclosure is directed to wireless devices that harvest or collect energy (for example, solar energy) from the environment or location in which they are placed and provide an antenna or antennas for wireless access or communication on a relatively small form factor, preferably one that is coextensive with a largest component of the device, e.g., an antenna layer. The devices are able to sense and/or control certain specific parameters of a system (a motor or environmental conditions, as non-limiting examples); store energy (harvested from the local environment), e.g., in a supercapacitor system or battery system; transmit collected data as signals via a wireless communication link, e.g., RF or optical link; the devices may also be able to receive information from other devices and relay them on or over, for example, a mesh network. Such devices may accordingly be self-powered and wireless devices, and not dependent on a separate device or form factor to provide a power source. This means that such devices can be entirely or substantially entirely autonomous, can be mobile or fixed, and may require little servicing over a period of time. Devices according to the present disclosure can thus be used as sensor nodes in a network, e.g., a wireless mesh network.

Embodiments of the present disclosure include systems, apparatus, and/or methods providing functionality for devices to operate autonomously and/or wirelessly in connection to/with a network such as the Internet, a local area network ("LAN"), a wide area network ("WAN") or other such network(s). Embodiments of the present disclosure are able to gather data and transmit data to or over a network, e.g., to a remote data acquisition and analysis port, which may be reached, at least in part, wirelessly. In exemplary embodiments, the wireless devices according to the present disclosure are self-powered and harvest (or, equivalently stated, procure, derive, or obtain) power wirelessly to/with any and all resources available to the device, e.g., in or from its ambient environment.

Exemplary embodiments of the present disclosure provide wireless devices having a footprint, or form factor, which does not appreciably exceed that needed for the sensors used for the device(s). The devices are preferably no larger (e.g., in area) than the largest of the sections or components (e.g., layers) used to execute the respective functions. In exemplary embodiments, a wireless device may include one or more antennas or antenna arrays. The antenna(s) or array(s) may be configured in a layer, e.g., disposed on a flexible or rigid substrate. Such antennas can have sufficient electrical size so as to avoid being overly electrically small. Such antennas can work properly when placed in the vicinity of something or state that is to be monitored by the sensor(s) of the device. Exemplary embodiments of the present disclosure include, make use of, and/or provide: a power gathering or harvesting section; a sensing section, e.g., a sensor layer or device; transmit and or transceiver apparatus; power storage; and one or more antennas. Exemplary embodiments include or provide a self-powered, wireless communicating sensor that incorporates all of these attributes in the same form factor, essentially a dual-use or multiple-use of the area or "aperture." Accordingly, embodiments of the present disclosure may be referred to as aperture engine sensors or "AES."

FIG. 1 depicts an exemplary embodiment of a general AES structure (or, simply AES) too according to the present disclosure. As shown, structure too can include a stack of layered components or layers no. Exemplary layers no are indicated as including an antenna layer 112, a sensing layer (equivalently, "sensor layer") 114, an energy harvesting layer u6, a processing layer u8, a reception/transmission layer 120, and a power storage layer 122. Of course, while structure 100 is shown having a preferred ordering of layers 112-122, other orderings and arrangements of such layers may be implemented for other embodiments of the present disclosure.

Figure 2:
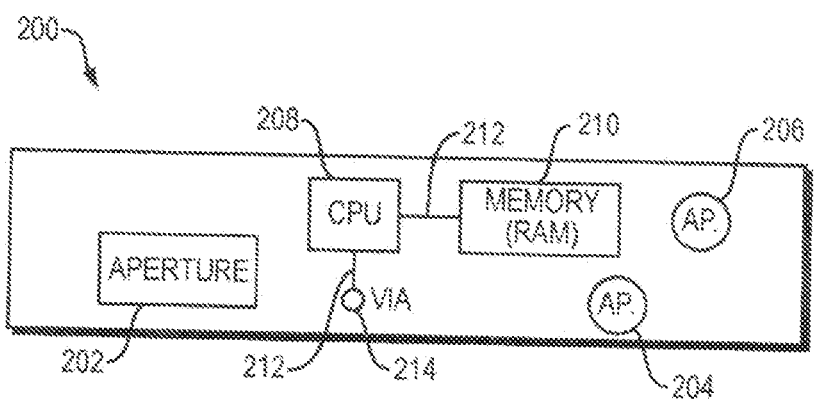
FIG. 2 depicts an AES layer possessing a degree of lacunarity, in accordance with exemplary embodiments of the present disclosure.

Each layer of AES 100 may have or provide a single functionality; of course, while this is preferred, a layer can provide more than one or less than a complete functionality in other embodiments. The layers may have the same thickness; or the layers may have different thicknesses; some of the layers may have the same or substantially the same thickness while other layers in a stack may have different thicknesses. Moreover, a layer's thickness need not be uniform but may vary across the layer's area. In some embodiments, one or more of the layers may have a degree of lacunarity such that there are one or more voids, holes, or apertures in the layer; an example of a layer having a degree of lacunarity is shown in FIG. 2, described in further detail below.

An antenna layer such as antenna layer 112 may include a single antenna, multiple individual antennas, or one or more arrays of antenna elements. In exemplary embodiments, the antenna layer may be substantially translucent and/or transparent to optical radiation (IR, visible, and/or UV); it will be appreciated that such transparency and/or translucency may facilitate energy harvesting with solar cells, e.g., in an adjacent energy harvesting layer. In preferred embodiments, an antenna layer 112 incorporate fractal and/or metamaterial resonators or antennas or other shaped elements that allow energy collection (or, harvesting) to occur in one or more adjacent components (e.g., layers). Antenna layer 112 may be designed for operation at desired RF frequencies and wavelengths, e.g., 2G, 3G, 4G, 5G, ISM, other cellular bands, and/or WiFi bands, which are given as non-limiting examples. Antenna layer 112 may be composed of a single layer of material, e.g., unconnected or connected resonator shapes or antenna elements; or, antenna layer 112 may be composed of multiple layers of material, e.g., unconnected or connected resonator shapes or antenna elements disposed on or between one or more substrates, e.g., a suitable dielectric substrate such as polyimide, FR4, or the like. Suitable fractal antenna arrays are described in U.S. Pat. Nos. 10,283,872, 10,014,586, U.S. Patent Publication No. 2019/0128624, U.S. Pat. Nos. 9,935,503, and 9,482,474; the contents of all of which patents and published application are incorporated herein in their respective entireties. Examples of suitable metamaterial shapes for resonators/antennas include but are not limited to planar split-ring resonators and complementary split-ring resonators.

In exemplary embodiments, antennas of antenna layer 112 may provide energy harvesting functionality; such functionality may be used by an AES in conjunction with or in place of a separate energy harvesting layer, e.g., layer n6. For example, layer 112 may include an antenna array designed, e.g., by appropriate scaling or designed shape of the individual array elements to receive RF energy from the local environment—such RD energy may be ambient at or directed to the position of the AES. It will be appreciated that while RF signals are described as being used for exemplary embodiments, the scope of the present disclosure is not limited to such; indeed, optical signals—e.g., as sent from a laser diode and/or received by a photodetector may be transmitted/received by the antenna layer 112 in other embodiments.

A sensing or sensor component (e.g., layer) such as sensing layer 114 may include virtually any type of desired sensor. Examples include but are not limited to temperature sensors, proximity sensors, pressure sensors, chemical sensors, water quality sensors, gas sensors, smoke sensors, infrared (IR) sensors, level sensors, image sensors, motion detection sensors, accelerometer sensors (accelerometers), gyroscopic sensors, humidity sensors, optical sensors, radiation sensors, and magnetic sensors. In preferred embodiments, sensors have a relatively thin vertical height or thickness such that they facilitate a small and/or conformable form factor.

Temperature sensors. Examples of temperature sensors within the scope of the present disclosure include, but are not limited to, any of the following: thermocouples, resistive (resistor) temperature detectors (RTD), thermistors, integrated circuit (IC), infrared sensors, and bolometers (including but not limited to microbolometers).

Proximity sensors. Examples of proximity sensors within the scope of the present disclosure include, but are not limited to, any of the following: capacitive sensors, inductive sensors, photoelectric sensors, and ultrasonic sensors.

Pressure sensors. Examples of pressure sensors within the scope of the present disclosure include, but are not limited to, microelectromechanical systems (MEMS)-based capacitive pressure sensors.

Chemical sensors. Examples of chemical sensors within the scope of the present disclosure include, but are not limited to, any of the following: chemical field effect transistors (FETs), chemiresistors, electrochemical gas sensors, fluorescent chloride sensors, hydrogen sulfide sensors, non-dispersive infrared sensors, pH glass sensors, potentiometric sensors, and zinc oxide nanorod sensors.

Water quality sensors. Examples of water quality sensors within the scope of the present disclosure include, but are not limited to, any of the following: pH sensors, Oxygen-Reduction Potential sensors, conductivity sensors, turbidity sensors, total organic carbon sensors, and chlorine residual sensors.

Gas sensors. Examples of gas sensors within the scope of the present disclosure include, but are not limited to, any of the following: carbon dioxide sensors, breathalyzer sensors (detecting ethyl alcohol), carbon monoxide detectors, catalytic bead sensors, hydrogen sensors, air pollution sensors, nitrogen oxide sensors, oxygen sensors, ozone monitors, electrochemical gas sensors, gas detectors, and hygrometers.

Smoke sensors. Examples of smoke sensors (equivalently, "smoke detectors") within the scope of the present disclosure include, but are not limited to, any of the following: optical smoke sensors (photoelectric), and ionization smoke sensors.

Infrared (IR) sensors. Examples of IR sensors within the scope of the present disclosure include, but are not limited to, any of the following: passive sensors including, but not limited to thermocouple-thermopile detectors, bolometers, pyroelectric detectors, photoconductor-based detectors, and photovoltaic detectors such as photodiodes; active sensors. Suitable known materials (e.g., semiconductor alloys) and doping levels can be used for specific wavelengths of interest; cooling may be used.

Level sensors. Examples of level sensors within the scope of the present disclosure include, but are not limited to, any of the following: point level sensors, and continuous level sensors.

Image sensors. Examples of image sensors within the scope of the present disclosure include, but are not limited to, any of the following: charge coupled devices (CCD), complementary metal-oxide-semiconductor (CMOS) devices, micro-channel plates, etc. Suitable known materials (e.g., semiconductor alloys) can be used for specific wavelengths of interest; cooling may be used.

Motion detection sensors. Examples of motion detection sensors within the scope of the present disclosure include, but are not limited to, any of the following: passive infrared (IR), ultrasonic, and microwave (RF).

Accelerometer sensors. Examples of accelerometer sensors within the scope of the present disclosure include, but are not limited to, any of the following: capacitive accelerometers, piezoelectric accelerometers, and Hall-effect accelerometers.

Gyroscopic sensors. Examples of gyroscopic sensors within the scope of the present disclosure include, but are not limited to, any of the following: micro-electro-mechanical systems (MEMS), and optical (fiberoptic) gyroscopes.

Humidity sensors. Examples of humidity sensors within the scope of the present disclosure include, but are not limited to, any of the following: capacitive sensors, resistive sensors, and thermal conductivity sensors.

Optical sensors. Examples of optical sensors within the scope of the present disclosure include, but are not limited to, any of the following: photodetectors, fiberoptic-based devices, and pyrometers; examples of photodetectors include, but are not limited to, photoconductors, photodiodes and avalanche photodiodes (APDs). Examples of photodiodes within the scope of the present disclosure include, but are not limited to, p-n photodiodes, p-n photodiodes, heterostructure photodiodes, and Schottky-barrier photodiodes (equivalently, "metal-semiconductor" photodiodes). Suitable known materials (e.g., semiconductor alloys) can be used for specific wavelengths of interest; cooling may be used.

Radiation sensors. Examples of radiation sensors within the scope of the present disclosure include, but are not limited to, any of the following: solid state detectors including, but not limited to, semiconductor detectors and solid scintillators, nuclear emulsion detectors, including but not limited to, silver-halide film ionizing radiation detectors, and nuclear track detectors; semiconductor detectors can include, but are not limited to, germanium-based detectors, and/or silicon-based detectors. Examples of silicon-based detectors include, but are not limited to, surface barrier devices, PIN diodes, and Si (Li) devices.

Magnetic sensors. Examples of magnetic sensors within the scope of the present disclosure include, but are not limited to, any of the following: coil sensors, fluxgate sensors, optically pumped sensors, nuclear precession sensors, superconducting quantum interference (SQUID) sensors, spin exchanged relaxation-free (SERF) magnetometers, Hall-effect sensors, anisotropic magnetoresistance sensors, giant magnetoresistance sensors, magnetic tunnel junctions sensors, giant magnetoimpedance sensors, piezoelectric composite sensors, magnetodiode sensors, magnetotransistor sensors, fiber optic sensors, magneto-optic sensors as well as microelectromechanical systems (MEMS)-based magnetic sensors.

An energy harvesting layer such as energy harvesting layer u6 may include any type of suitable energy harvesting functionality. Examples of energy harvesting within the scope of the present disclosure include, but are not limited to, any of the following: solar/photovoltaic; thermal, including, but not limited to pyroelectric and thermoelectric, e.g., those based on Bi, Sb, Te, and/or Se, to name just a few; Peltier devices; chemical or ionic liquid electrolytes or redox-active liquids electrolytes; kinetic/motion; piezoelectric; RF; and, metamaterial-based energy harvesting. Kinetic/motion-based energy harvesting can include, but is not limited to, piezoelectric, triboelectric, and insertional induction. In exemplary embodiments, photovoltaic (solar) cells are used for energy harvesting layer n6. In exemplary embodiments, fractal antennas are used for energy harvesting layer and receive RF power from ambient or directed RF transmissions received by the AES 100.

In exemplary embodiments, the processing layer n8 can include sensor and data acquisition electronics along with computational platform (e.g., including a processor or processors) for encoding (data from the sensors) for transmission. Processing layer 118 may include a timing mechanism for data acquisition and transmission/reception. Processing layer 118 may include mesh relay circuitry for relaying wirelessly to nearby sensor systems as needed.

In exemplary embodiments, the reception/transmission layer 120 may include an antenna and or fractal plasmonic surface; RF transceiver chip and circuitry; optionally, a GPS layer or device for timing and or position may also be included.

In exemplary embodiments, the power storage layer 122 may include solar cells and/or rectifying antenna ("rectenna") for power harvesting; battery with power management circuit; and/or super capacitor for power storage. In some embodiments, a piezo vibrational circuit for energy harvesting may be included. In exemplary embodiments, photovoltaic (solar) cells are used for energy harvesting layer 116.

Examples of uses for or applications of AESs such as AES 100 include, but are not limited to, the following: monitoring and/or controlling infrastructure such as roads, bridges, buildings, locks, waterways, support structure, towers, communications equipment; lighting; pipelines; electric grid towers and hardware; vehicles; vessels; spacecraft; jets, helicopters and planes; lighter-than-air craft, e.g., blimps; drones; plants, trees, and forests; crops; farm machinery; soil and/or water and/or air.

As was noted previously, one or more layers of an AES may possess a degree of lacunarity. Lacunarity indicates the presences of gaps, apertures, or voids within a structure such as a layer of an AES. FIG. 2 depicts an example of an AES layer 200 having a degree of lacunarity. Lacunarity may be measured, e.g., by suitable techniques such as standard box counting or a sliding box algorithm.

As shown in FIG. 2, layer 200 includes multiple apertures 202-206 disposed through its depth (thickness in the direction normal to the figure). Apertures 202-206 may have different shapes (compare 202 with 204) or they may have similar shapes (compare 204 with 206). The presence of apertures 202-206 may, e.g., allow radiation (e.g., RF, solar, heat) to pass through the layer and to or between other layers in a related stack of layers of an AES. In exemplary embodiments, apertures can present a regular pattern. In exemplary embodiments, apertures can present rotational invariance and/or heterogeneity. In preferred embodiments, apertures may define a fractal pattern or metamaterial pattern in a layer, e.g., antenna layer 112 of FIG. 1.

Layer 200 may also include various components 208-210, e.g., processors, discrete electrical components, memory units, etc., which may be connected by conductive paths, e.g., conductive traces or wire(s) or the like, 212. One or more connections 214, e.g., vias, may be present to provide electrical connection(s) to one or more other layers in the stack of layers of the AES for, e.g., power and/or data transfer.

Figure 3:
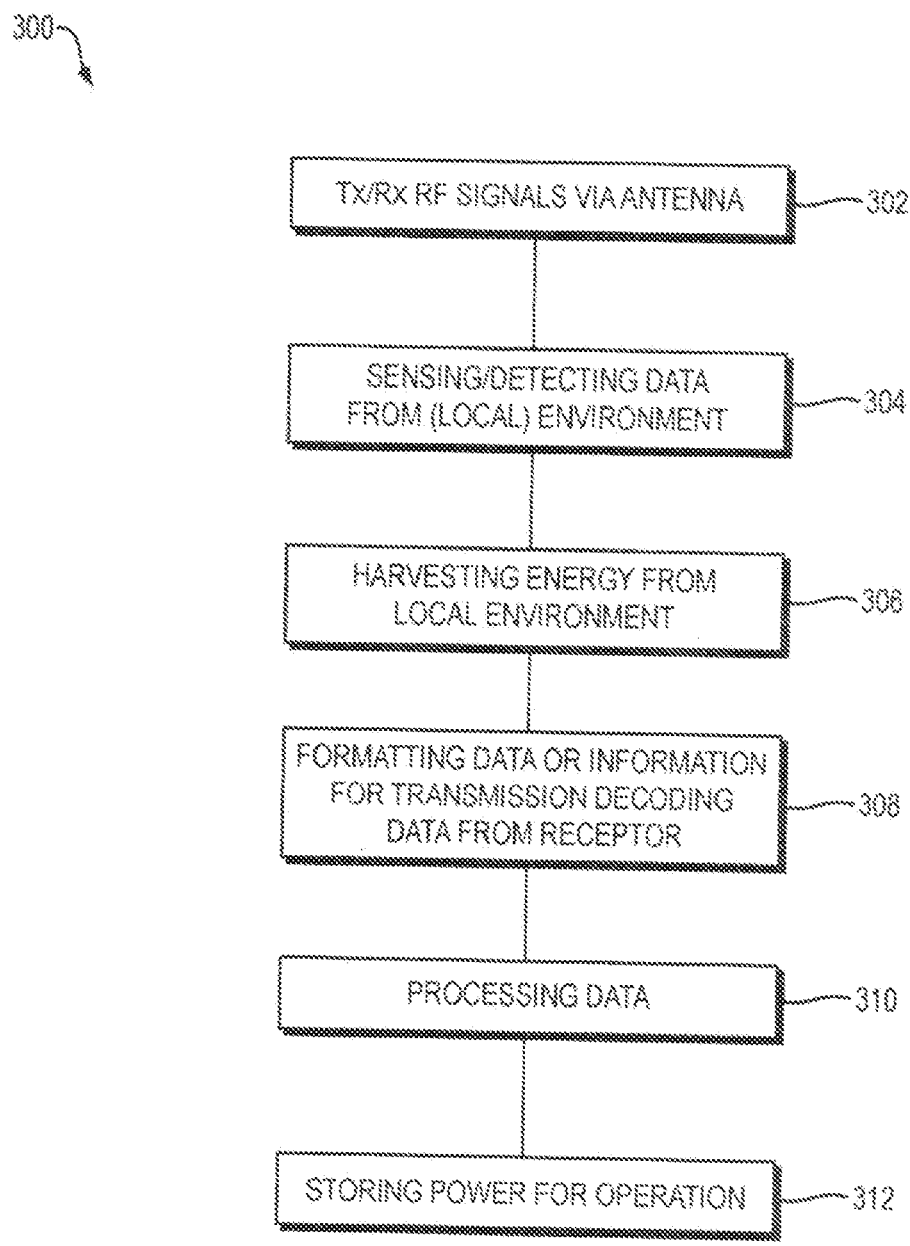
FIG. 3 depicts steps in a method of operation of an AES, in accordance with exemplary embodiments of the present disclosure.

FIG. 3 depicts steps in a method 300 of operation of an AES, in accordance with exemplary embodiments of the present disclosure. As shown at 302, signals may be received by or transmitted from an antenna component, e.g., antenna layer, of an AES. While RF signals are indicated, optical signals—e.g., as sent from a laser diode and/or received by a photodetector—may be transmitted/received in other embodiments. Data may be sensed or detected by one or more sensors of a sensing component/layer, as described at 304. Examples of such sensors are provided above for FIG. 1.

Continuing with the description of method 300, energy may be harvested from the environment (locale) local to the AES, as described at 306. Examples of energy harvesting layers are provided above for FIG. 1. Data or information from the sensors/sensing layer may be formatted for (e.g., encoded) for transmission and data/information can be decoded from a reception (such as from the antenna layer), as described at 308. Any suitable encoding and decoding techniques/formats can be used, e.g., such as are specified by known wireless standards including, but no limited to, IEEE 802.11, IEEE 802.a, IEEE 802.11b, IEEE 802.11e, IEEE 802.11g, IEEE 802.11n, IEEE 802.11ac, IEEE 802.11ac Wave 2, IEEE 802.11ad, IEEE 802.11ah, WiFi 4, WiFi 5, WiFi 6, GSM, 4G, LTE, LTE Advanced, 2G, 3G, WiMAX (IEEE 802.16d), Mobile WiMAX (IEEE 802.16e), WiMAX 2.0 (IEEE 802.16m), IEEE 802.15.4 (ZigBee), 5G, 6G, or any other standards that may be developed.

With continued reference to FIG. 3, data/signals from the sensors/sensing layer and/or data/signals received from the reception/transmission layer can be processed, e.g., by processing layer 118 of FIG. 1, as described at 310. Energy harvested by the harvesting layer may be stored in, e.g., the power (or energy) storage layer 122, as described at 312.

Accordingly, it will be appreciated that AES according to the present disclosure possess benefits over prior techniques and devices. The AES devices may be operated as sensor nodes in a mesh network.

Unless otherwise indicated, the AES and related method(s) of operation that have been discussed herein are or can be implemented with or as specially-configured computer processing systems (or sub-systems) specifically configured to perform the functions that have been described herein for the AES and related methods. Each computer system includes one or more processors, tangible memories (e.g., random access memories (RAMs), read-only memories (ROMs), and/or programmable read only memories (PROMS)); such systems or sub-systems may also optionally include tangible storage devices (e.g., hard disk drives and/or flash memories or the like), system buses, network communication components, input/output ports, and/or user interface devices (e.g., keyboards, pointing devices, displays, microphones, sound reproduction systems, and/or touch screens).

Each computer processing system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein, e.g., as shown and described for FIG. 3. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by "a" or "an" does not, without further constraint(s), preclude the existence of additional elements of the identical type.

None of the claims are intended to embrace subject matter that fails to satisfy the requirement of Sections lot, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A wireless sensor node for a mesh network, the sensor node comprising:
    an antenna layer operative to receive and transmit wirelessly, wherein the antenna layer includes a metamaterial surface;
    a sensing layer including a fractal surface, operative to detect data from one or more sensors;
    an energy harvesting layer operative to harvest energy from an environment local to the sensor node;
    a reception/transmission layer;
    a processing layer operative to process data from the sensing layer and signals received from or provided to the reception transmission layer; and
    a power storage layer operative to store energy received from the energy harvesting layer for use by the sensor node, wherein the antenna layer includes one or more fractals.

2. The wireless sensor node of claim 1, wherein the metamaterial surface includes one or more split-ring resonators.

3. The wireless sensor node of claim 1, wherein the energy harvesting layer includes a fractal plasmonic surface.

4. The wireless sensor node of claim 1, wherein the energy harvesting layer includes one or more photovoltaic cells.

5. The wireless sensor node of claim 1, wherein the multiple layers are conformable as a stack to a surface of an object.

6. A wireless sensor node for a mesh network, the sensor node comprising:
    an antenna layer operative to receive and transmit wirelessly, wherein the antenna layer includes a metamaterial surface;
    a sensing layer including a lacunar surface, operative to detect data from one or more sensors;
    an energy harvesting layer operative to harvest energy from an environment local to the sensor node;
    a reception/transmission layer;
    a processing layer operative to process data from the sensing layer and signals received from or provided to the reception transmission layer; and
    a power storage layer operative to store energy received from the energy harvesting layer for use by the sensor node, wherein the antenna layer includes one or more fractals.

7. The wireless sensor node of claim 6, wherein the metamaterial surface includes one or more split-ring resonators.

8. The wireless sensor node of claim 6, wherein the energy harvesting layer includes a fractal plasmonic surface.

9. The wireless sensor node of claim 6, wherein the energy harvesting layer includes one or more photovoltaic cells.

10. The wireless sensor node of claim 6, wherein the multiple layers are conformable as a stack to a surface of an object.

* * * * *